United States Patent
Yu et al.

(10) Patent No.: US 12,543,526 B2
(45) Date of Patent: *Feb. 3, 2026

(54) FULLY AUTOMATED WAFER DEBONDING SYSTEM AND METHOD THEREOF

(71) Applicant: Taiwan Semiconductor Manufacturing Co., Ltd., Hsin-Chu (TW)

(72) Inventors: Cheng-Fei Yu, Hsin-Chu (TW); Chang-Chen Tsao, Hsin-Chu (TW); Ting-Yau Shiu, Hsin-Chu (TW); Cheng-Kang Hu, Kaohsiung (TW); Hsu-Shui Liu, Pingjhen (TW); Jiun-Rong Pai, Jhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 270 days.

This patent is subject to a terminal disclaimer.

(21) Appl. No.: 18/197,312

(22) Filed: May 15, 2023

(65) Prior Publication Data

US 2023/0282494 A1  Sep. 7, 2023

Related U.S. Application Data

(63) Continuation of application No. 17/110,122, filed on Dec. 2, 2020, now Pat. No. 11,670,524.

(Continued)

(51) Int. Cl.
*H01L 21/687* (2006.01)
*B32B 43/00* (2006.01)
(Continued)

(52) U.S. Cl.
CPC ...... *H01L 21/67092* (2013.01); *B32B 43/006* (2013.01); *H01L 21/02032* (2013.01);
(Continued)

(58) Field of Classification Search
CPC ......... H01L 21/67092; H01L 21/02032; H01L 21/02079; H01L 22/12; H01L 24/799;
(Continued)

(56) References Cited

U.S. PATENT DOCUMENTS 7,189,304 B2 * 3/2007 Martinez ............... B28D 5/0011
156/716
7,406,994 B2 * 8/2008 Martinez ............... B28D 5/0023
83/468.93

(Continued)

FOREIGN PATENT DOCUMENTS

TW      201903881 A     1/2019

*Primary Examiner* — Eduardo A Rodela
(74) *Attorney, Agent, or Firm* — Birch, Stewart, Kolasch & Birch, LLP

(57) ABSTRACT

An apparatus and method for debonding a pair of bonded wafers are disclosed herein. In some embodiments, the debonding apparatus, comprises: a wafer chuck having a preset maximum lateral dimension and configured to rotate the pair of bonded wafers attached to a top surface of the wafer chuck, a pair of circular plate separating blades including a first separating blade and a second separating blade arranged diametrically opposite to each other at edges of the pair of bonded wafers, wherein the first and the second separating blades are inserted between a first and a second wafers of the pair of bonded wafers, and at least two pulling heads configured to pull the second wafer upwardly so as to debond the second wafer from the first wafer.

20 Claims, 6 Drawing Sheets

Related U.S. Application Data

(60) Provisional application No. 62/968,363, filed on Jan. 31, 2020.

(51) Int. Cl.
| | | |
|---|---|---|
| *H01L 21/02* | (2006.01) | |
| *H01L 21/18* | (2006.01) | |
| *H01L 21/66* | (2006.01) | |
| *H01L 21/67* | (2006.01) | |
| *H01L 23/00* | (2006.01) | |

(52) U.S. Cl.
CPC ...... *H01L 21/02079* (2013.01); *H01L 21/187* (2013.01); *H01L 21/67242* (2013.01); *H01L 21/687* (2013.01); *H01L 21/68764* (2013.01); *H01L 22/12* (2013.01); *H01L 24/799* (2013.01); *H01L 24/98* (2013.01); *B32B 2457/14* (2013.01)

(58) Field of Classification Search
CPC ................. H01L 24/98; H01L 21/6838; H01L 21/67011; H01L 21/77; H01L 21/187; H01L 21/2007; H01L 21/2011; H01L 21/67242; H01L 21/67253; H01L 21/67259; H01L 21/67288; H01L 21/687; H01L 21/68728; H01L 21/68764; B32B 43/006; B32B 2457/14; B32B 2457/01
See application file for complete search history.

(56) References Cited

U.S. PATENT DOCUMENTS

| | | | | |
|---|---|---|---|---|
| 8,083,115 | B2 * | 12/2011 | Rayssac | B28D 5/0052 |
| | | | | 156/254 |
| 8,845,859 | B2 * | 9/2014 | Ries | H01L 21/67092 |
| | | | | 156/760 |
| 9,601,365 | B2 * | 3/2017 | Honda | H01L 21/67092 |
| 9,724,906 | B2 * | 8/2017 | Itou | B32B 43/006 |
| 9,914,233 | B2 | 3/2018 | Landru | |
| 10,155,369 | B2 | 12/2018 | Tsao et al. | |
| 10,155,639 | B2 * | 12/2018 | Witczak | B66B 9/00 |
| 10,569,520 | B2 | 2/2020 | Tsao et al. | |
| 10,889,097 | B2 | 1/2021 | Tsao et al. | |
| 11,551,934 | B2 * | 1/2023 | Kawadahara | H01L 21/67092 |
| 11,670,524 | B2 * | 6/2023 | Yu | B32B 43/006 |
| | | | | 438/16 |
| 2001/0003668 | A1 | 6/2001 | Yanagita et al. | |
| 2015/0231790 | A1 * | 8/2015 | Landru | H01L 21/67092 |
| | | | | 156/762 |
| 2018/0108558 | A1 | 4/2018 | Yin et al. | |
| 2018/0147825 | A1 * | 5/2018 | Tsao | H01L 21/67092 |
| 2019/0118522 | A1 | 4/2019 | Tsao et al. | |

* cited by examiner

FULLY AUTOMATED WAFER DEBONDING SYSTEM AND METHOD THEREOF

CROSS-REFERENCE TO RELATED APPLICATIONS

This application is a continuation of U.S. patent application Ser. No. 17/110,122, which claims priority to U.S. Provisional Patent Application No. 62/968,363, filed on Jan. 31, 2020, each of which are incorporated by reference herein in their entireties.

BACKGROUND

In order to manufacture integrated circuits, semiconductor wafers are used to form integrated circuits. During the manufacturing process, integrated circuits are fabricated through a plurality of processing steps (e.g., etching steps, lithography steps, deposition steps, etc.) performed upon a semiconductor wafer (e.g., a silicon wafer), followed by dicing the semiconductor wafer into separate integrated circuits. In some applications, the wafers are bonded together to form a wafer stack. In other applications, in order to realize higher integration, simplify packaging processes, or to couple circuits or other components, two or more wafers may be bonded together before the dicing step, which allows the integrated circuits to be fabricated on both sides of the wafer after a thin down. Moreover, since a wafer level bonding shows an increased promise for "More than Moore" technologies, where added value is provided to devices by incorporating functionality that does not necessarily scale according to Moore's Law, wafer debonding is becoming a desired process for separating one wafer from another. Furthermore, during the inspection of the bonded wafer, the bonding may be found to be defective and the wafers may need to be debonded from each other. If bonding of the wafer stack is successful, some residual process may be performed on the wafer to complete the manufacturing process.

However, some wafer stacks are difficult to separate using conventional mechanical or chemical methods. In addition, wafers are sometimes relatively thin making them ill-suited to withstand the forces applied during debonding processes. As such, wafers may experience failure during the debonding process. Current single sided wafer debonding systems and methods use a flat blade that is repeatedly (e.g., four times) inserted and retracted at the bevel region of the wafer while the wafer rotates 360° degrees. However, current wafer debonding systems and methods are inefficient and often result in wafer breakages and large edge defect rates at the opposite side of the flat blade insertion point. On the other hand, the double sided debonding systems and methods have a lower risk of defects near the wafer edges, but may require a larger pull force which may result in wafer breakages. Accordingly, current wafer debonding systems and methods are not entirely satisfactory.

The information disclosed in this Background section is intended only to provide context for various embodiments of the invention described below and, therefore, this Background section may include information that is not necessarily prior art information (i.e., information that is already known to a person of ordinary skill in the art). Thus, work of the presently named inventors, to the extent the work is described in this background section, as well as aspects of the description that may not otherwise qualify as prior art at the time of filing, are neither expressly nor impliedly admitted as prior art against the present disclosure.

BRIEF DESCRIPTION OF THE DRAWINGS

Various exemplary embodiments of the present disclosure are described in detail below with reference to the following Figures. The drawings are provided for purposes of illustration only and merely depict exemplary embodiments of the present disclosure to facilitate the reader's understanding of the present disclosure. Therefore, the drawings should not be considered limiting of the breadth, scope, or applicability of the present disclosure. It should be noted that for clarity and ease of illustration these drawings are not necessarily drawn to scale.

DETAILED DESCRIPTION

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

Figure 1A:
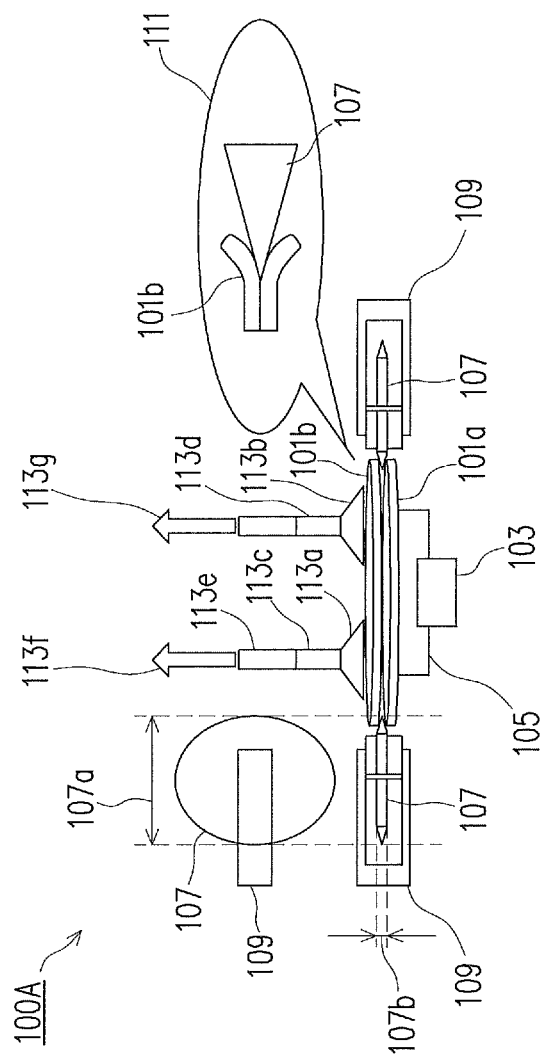
FIG. 1A illustrates an example of a wafer debonding system for debonding a pair of bonded wafers using a pair of circular plate blades, in accordance with some embodiments of the present disclosure.

FIG. 1A illustrates an exemplary wafer debonding system 100A for debonding a pair of bonded wafers according to some embodiments. As shown in FIG. 1A, a wafer chuck 105 is provided for holding a first wafer 101a and a second wafer 101b bonded to each other. In this exemplary embodiment, the wafer chuck 105 may be attached to a suitable fixture 103 using mechanical, electrical, or magnetic attachments techniques. In some further embodiments, the first wafer 101a may be attached to the wafer chuck 105 using a vacuum suction technique. Moreover, the first 101a and the second 101b bonded wafers may be placed on the wafer chuck 105 with the first wafer 101a in direct contract with a top surface of the wafer chuck 105. In various embodiments, the second wafer 101b may be bonded to the first wafer 101a through direct or indirect bonding techniques. For example, the second wafer 101b may be bonded to the first wafer 101a through silicon fusion bonding, oxide bonding, hybrid bonding, or adhesive bonding techniques.

Referring to FIG. 1A, the wafer debonding system 100A may include a pair of blades 107 that are placed at edges of the bonded wafers 101a and 101b. In some embodiments, the pair of blades 107 may be arranged diametrically opposite to each other (i.e., on opposite sides of the bonded wafers 101a and 101b) or at a preset angle from one another with respect to a center axis of rotation of the bonded wafers 101a and 101b. In various embodiments, the pair of blades 107 may have a shape of a circular plate with a diameter 107a in a range of from about 14 mm to about 50 mm and a thickness 107b in a range of from about 2 mm to about 6 mm. In some further embodiments, as shown in an exemplary cross-sectional edge view 111, the pair of blades 107 may have triangular shaped edges. In other embodiments, the pair of blades 107 may have circular or square shaped edges.

The separating blades 107 may be inserted in an area between the first wafer 101a and the second wafer 101a and the area may have a beveled edge to assist with the insertion, in accordance with some embodiments. In various embodiments, pulling heads 113a and 113b may respectively be attached to coil springs 113e and 113d that are configured to control first and second pulling forces 113f and 113g. In some embodiments, the pulling heads 113a and 113b continuously assert the first and second pulling forces 113f and 113g as the pair of blades 107, arranged diametrically opposite to each other, are rotatably inserted between the first and second wafers 101a and 101b by an increasing amount until an automatic optical inspection (AOI) system 109 detects that the first and second wafers 101a and 101b have been de-bonded on at least one edge (and/or on both edges). The insertion point may, in some embodiments, be precisely controlled with the AOI system 109, which may include, for example, motors, actuators, and other optical instruments, as well as a controller circuitry and/or a processor for performing the operations described herein. In some further embodiments, the AOI system 109, may further include a pair of three-dimensional cameras or charge-coupled device cameras configured to check the debonding processes and provide information to the controller and/or processor for further adjustment of the separating blades 101a and 101b. In various embodiments, the AOI system 109 may also determine how much further the blades 101a and 101b should be inserted between the first wafer 101a and the second wafer 101b, or whether to increase or decrease the pulling forces 113f and 113g applied to the second wafer 101b. Moreover, the AOI system 109 may also measure an inserting speed, depth, and slope of the pair of blades 107 and feedback the measured parameters to the controller that is configured to control the rotating speed of the pair of blades 107 and the rotating speed of the first 101a and second 101b bonded wafers.

In some further embodiments, a flex wafer assembly may be provided to hold and move the second wafer 101b of the pair of bonded wafers. The flex wafer assembly may be controlled by programmable drive motors and may be configured to receive the measured parameters such as the inserting speed, depth, and slope of the pair of blades 107 from the AOI system. In some embodiments, the flex wafer assembly may comprise at least two pulling heads, the first pulling head 113a and the second pulling head 113b that are placed diametrically opposite to each other about a central axis of the wafer chuck (and/or about a central axis of the pair of bonded wafers).

The pulling heads 113a and 113b may be configured to apply longitudinal pull forces that are perpendicular to the surface of the second wafer 101b and to separate and remove the second wafer 101b from the first wafer 101a. In various embodiments, the longitudinal pull forces may be in a range of from about 0.1 kilogram-force (kgf) to about 10 kilogram-force (kgf). The pulling forces in the above disclosed range can provide a sufficient torque, while minimizing the risk of wafer breakage. In some embodiments, different pull forces may be applied by the pulling heads 113a and 113b in order to provide unbalanced torques which may result in a more efficient debonding process. As such, the amount of the unbalanced torques may be determined based on a debonding crack length estimated from the cross-sectional shape of the pair of blades 107. In some embodiments, the pulling head 113a is configured as a suction cup attached to a coil spring 113c and to a vacuum hose/conduit 113e. In some embodiments, the vacuum hose/conduit runs through the coil spring 113c. The pulling head 113b may be constructed in similar fashion as the pulling head 113a, and is attached to a second coil spring 113d and second vacuum conduit 113e. Moreover, each of the vacuum conduits 113e may be attached to a vacuum source configured to provide a desired vacuum pressure to the pulling head 113a. In some embodiments, the same vacuum source may be shared by the pulling heads 113a and 113b. In some embodiments, the pulling heads 113a and 113b may have adjustable top vacuum cup positions, for example, in a range of from about 3 cm to about 9 cm above the top surface of the second wafer 101b. In one embodiment, a vacuum system may be shared by the pulling heads 113a and 113b providing the pull forces. Moreover, the pulling heads 113a and 113b may be powered by motors or other actuators configured to pull up the second wafer 101b, after the bonded wafers are rotated by 180° degrees or by one or more circles. In some embodiments, an angle of rotation of the bonded wafers 101a and 101b is based on the separation success rates, wafer breakage rates, wafer defects rates, and/or wafer scratch rates.

In various embodiments, a pair of coil springs 113c and 113d may be attached to the pulling heads 113a and 113b to buffer the pull forces and to minimize a hard landing on the bonded wafers. In some embodiments, the pair of coil springs may have different spring coefficients, such that a first pull force applied by the first pulling head 113a is smaller than a second pull force applied by the second pulling head 113b. In this regard, spring coefficients of the pair of coil springs can be in a range of from about $1\times10^2$ N/m to about $1\times10^5$ N/m to provide soft landing on the bonded wafers. In some embodiments, to provide sufficiently unbalanced torques on the first and second pulling heads 113a and 113b, the spring coefficient of a first coil spring can be, for example, 10 to 100 times greater than the spring coefficient of the second coil spring.

Figure 1B:
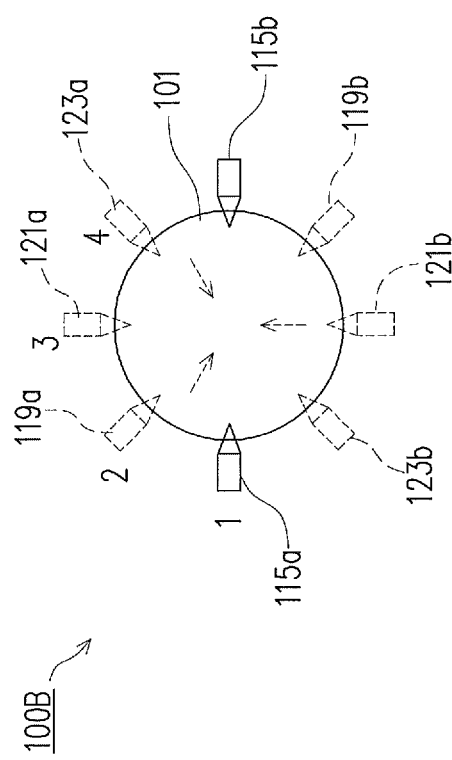
FIG. 1B illustrates a schematic diagram of a wafer debonding method for debonding a pair of bonded wafers using a plurality of separating blades equally spaced from each other around the wafers, in accordance with some embodiments of the present disclosure.

FIG. 1B illustrates a schematic diagram of a wafer debonding method 100B for debonding a pair of bonded wafers using a plurality of separating blades equally spaced from each other around the bonded wafers, in accordance with some embodiments. As shown in FIG. 1B, a pair of bonded wafers 101 can be separated using a pair of separating blades 115a and 115b having different thicknesses and inserted therebetween from edges of the pair of bonded wafers 101. In various embodiments, the pair of separating blades 115a and 115b is arranged diametrically opposite to each other. In some embodiments, a plurality of separating blades may be used for the wafer debonding process 100B. This approach may result in a smaller amount of wafer rotations. For example, separating blades 115a, 119a, 121a, 123a, 115b, 119b, 121b and 123b may be equally spaced from each other and arranged around the bonded wafers 101. More specifically, the separating blades 115a, 119a, 121a, 123a, 115b, 119b, 121b and 123b may be arranged around the bonded wafers 101 spaced by 45° degrees from each other. This arrangement of the separating blades, in particular, allows for only 45° wafer rotation to achieve a debonding crack around the edges of the bonded wafers 101.

Figure 1C:
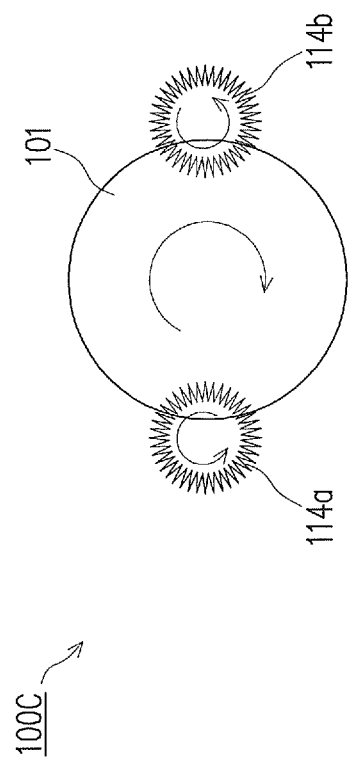
FIG. 1C illustrates a schematic diagram of a wafer debonding method for debonding a pair of bonded wafers using a pair of circular plate blades rotating in a reverse direction of the rotating wafers, in accordance with some embodiments.

FIG. 1C illustrates a schematic diagram of a wafer debonding method 100C for debonding a pair of bonded wafers 101 using a pair of circular plate blades 114a and 114b that rotate in an opposite direction of the pair of rotating bonded wafers 101, in accordance with some embodiments. For example, as shown in FIG. 1C, the bonded wafers 101 can be rotated in a clockwise direction by the wafer chuck, while the circular plate blades 114a and 114b are rotated in a counter-clockwise direction, in accordance with some embodiments. In this way, damage to the edge or bevel of the bonded wafers 101 can be significantly reduced. In some embodiments, rotation as well as insertion speeds of the circular plate blades 114a and 114b may be different. In some embodiments, the rotation and insertion speeds of each of the circular plate blades 114a and 114b are individually controlled by the AOC system 109, as described above.

Figure 2:
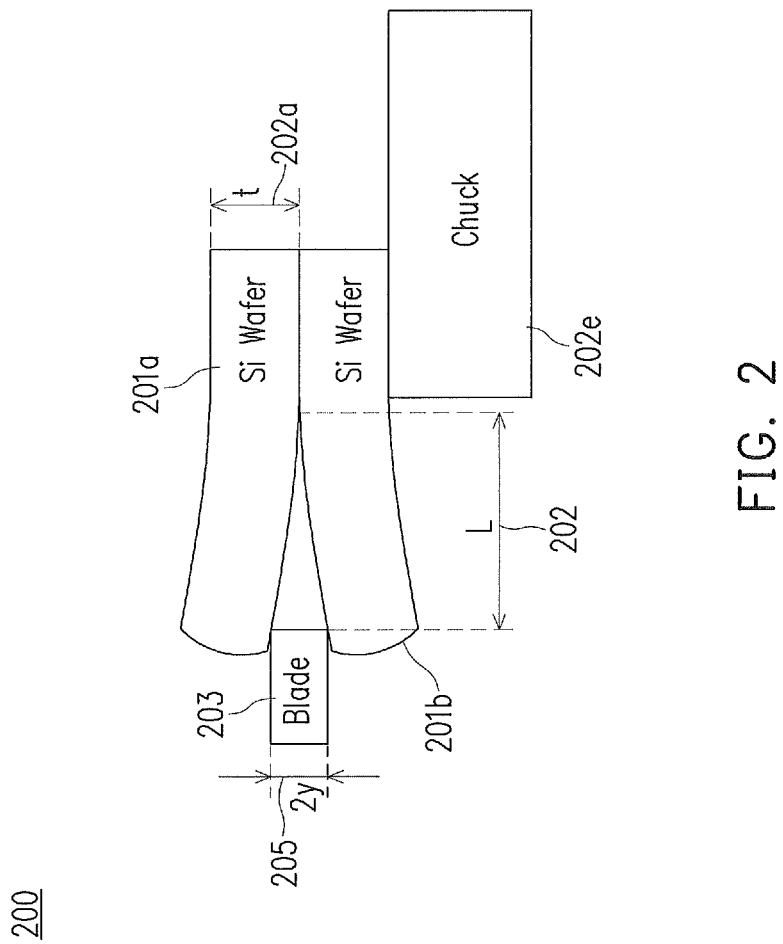
FIG. 2 illustrates a cross-sectional view of an application of a wafer debonding system for debonding bonded wafers, in accordance with some embodiments of the present disclosure.

FIG. 2 illustrates a schematic diagram of a single side of a wafer debonding system 200 for debonding a pair of bonded wafers according to some embodiments. The wafer debonding system 200 comprises of a separating blade 203 having a thickness 205 and a wafer chuck 202e that is concentric to a pair of bonded wafers 201a and 201b during the debonding process. As shown in FIG. 2, the separating blade 203 is inserted between the edges of the pair of bonded wafers 201a and 202b. In some embodiments, a pair of separating blades may also be arranged diametrically opposite to each other with respect to the bonded wafers 201a and 201b. In some embodiments, such pair of separating blades have the same thickness and are configured to be inserting between the edges of the pair of bonded wafers 201a and 202b on opposite sides of the bonded wafers 201a and 201b.

In some embodiments, a diameter of the wafer chuck 202e may be in a range of from about 150 mm to about 250 mm such that peripheral edge portions of the bonded wafers 201a and 202b have enough space to deform while receiving sufficient support from the wafer chuck 202e. In some embodiment, the diameter of the wafer chuck 202e may be smaller than the maximum diameter of the pair of bonded wafers 201a and 201b. A free standing length or a induced crack length L 202 needed for performing the debonding process may be determined based on the following relationship:

$$\gamma = \frac{3}{8}\left(\frac{Et^3y^2}{L^4}\right),$$

where $\gamma$ is the surface energy related to the work required to cut a bulk sample of a first wafer 201a, E is the Young's modulus, which is measures the stiffness of the bonded wafers 201a and 201b, t is the thickness 202a of the wafer 201a, 2y is a thickness 203 of a separating blade 205, and L is the induced crack length 202 formed between the bonded wafers. As such, given a range of acceptable thicknesses 203 for the separating blade 205 and a range of acceptable wafer chuck diameters, a range for the induced crack length L 202 may be determined based on the above disclosed relationship. For example, if the separating blade 205 thickness is in the range of $1\times10^{-3}$ to $2\times10^{-4}$ meters (m), the surface energy is in the range of 0.2 to 0.5 J/m², and the wafer chuck's 202e diameter is in the range of 154.042159 to 248.089 mm, than the range for the induced crack length L 202 is in the range of 72.97892052 to 25.95538 mm, given that silicon's Young's modulus is $1.3\times10^{11}$ Pa and the thickness of the bonded wafers is 0.000775 mm.

Figure 3B:
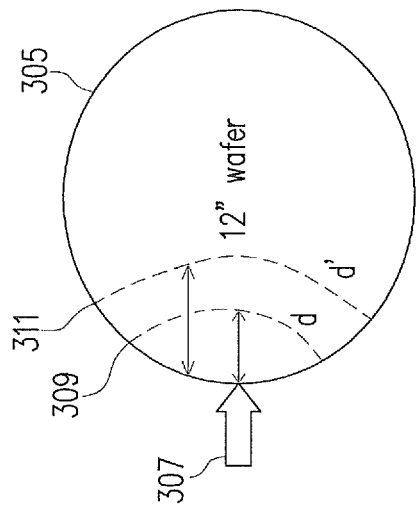
FIG. 3B illustrates a top view of a wafer debonding system with de-bond wavefronts, in accordance with some embodiments.
Figure 3A:
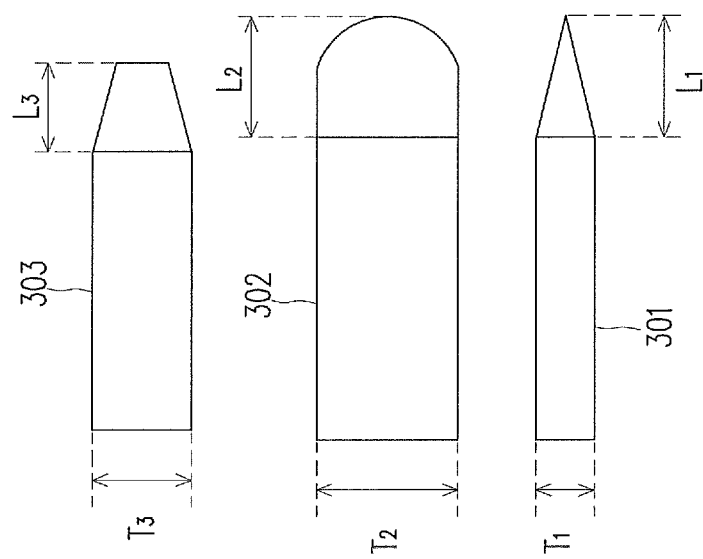
FIG. 3A illustrates cross-sectional and top views of a separating blade of a wafer debonding system shown in FIG. 1A, 1B, 1C, or 2, in accordance with some embodiments.

FIG. 3A illustrates cross-sectional views of exemplary separating blades 301, 302 and 303 that can be used in the wafer debonding systems shown and described with respect to FIGS. 1A, 1B, 1C, and 2 above, in accordance with various embodiments of the present disclosure. For example, a separating blade 301 may have a pointed end as shown in the cross-sectional view illustrated in FIG. 3A. In some embodiments, the separating blade 301 may have a thickness $T_1$ in the range of about 2 mm to about 4 mm. In some embodiments, the separating blade may have a leading portion having a depth $L_1$ in the range of about 2 mm to about 5 mm. As shown in FIG. 3A, a separating blade 302 may have a rounded front wedge as shown in the cross-sectional view designed to reduce scratch risk. In some embodiments, the separating blade 302 may have a thickness $T_2$ in a range of from about 2 mm to about 10 mm and a leading portion having depth $L_2$ in a range of from about 2 mm to about 10 mm. As further shown in FIG. 3A, a separating blade 303 may have a square front wedge as shown in the cross-sectional view. In some embodiments, the separating blade 303 may have a thickness $T_3$ in a range of about 2 mm to about 4 mm and leading portion having a depth $L_3$ in a range of about 3 mm to about 5 mm.

In various embodiments, the separating blades shown in FIG. 3A can be made of a material with a small scratch hardness (e.g., smaller than 5 gigapascals (GPa) when the wafers to be debonded are made of silicon) to reduce scratch risk, and a high Young's modulus (e.g., greater than about 3 gigapascals (GPa)) to create an initial debonding area without wafer defects. In some embodiments, the scratch hardness of the separating blades 301, 302 and 303 can be smaller than that of the material of wafers to be debonded (e.g. wafers 101a, 101b in FIG. 1). In other embodiments, the separating blades 301, 302 and 303 can be made of polyetheretherketone (PEEK), Aluminum (Al), or Teflon with a scratch hardness in a range of from about 0.05 GPa to about 0.3 GPa, and a Young's modulus in a range of from about 3 GPa to 3.95 GPa, or other materials exhibiting such Young's modulus and hardness.

FIG. 3B illustrates a top view of a debonding process performed by a wafer debonding system shown in FIG. 1, in accordance to some embodiments. During the debonding process, a separating blade 307 may be inserted into a wafer 305 at a length d 309. Moreover, based on the initial pull force applied by the pulling heads 113a and 113b (FIG. 1A), an initial debonding area can expanded to an enlarged debonding area d' 311 (as shown by dashed lines) thereby reducing the risk of wafer cracks.

Figure 4:
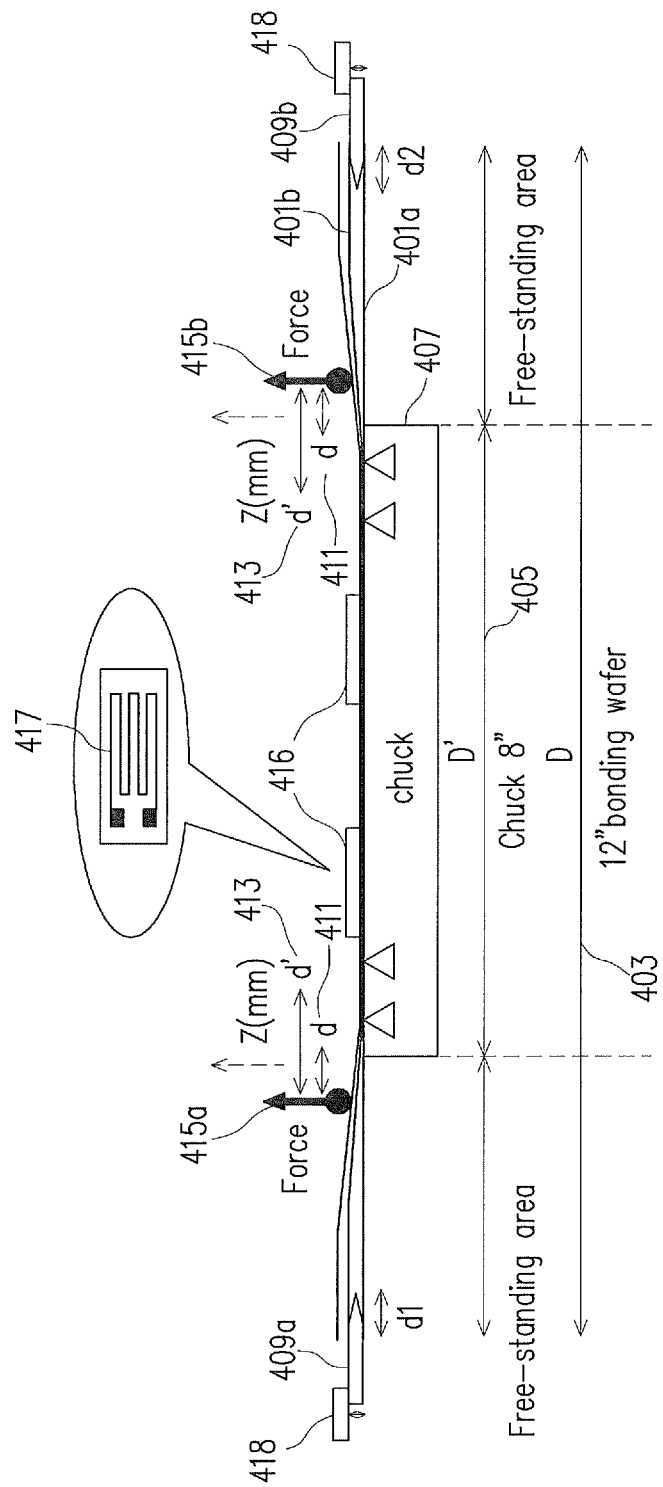
FIG. 4 illustrates a schematic diagram of a wafer debonding method for debonding a pair of bonded wafers using a pair of pulling heads with different pull forces, in accordance with some embodiments.

FIG. 4 illustrates a schematic diagram of a wafer debonding method for debonding a pair of bonded wafers using a pair of pulling heads with different pull forces, in accordance with some embodiments. As shown in FIG. 4, a first separating blade 409a and a second separating blade 409b are inserted between a first wafer 401a and a second wafer 401b to a first distance d1 and a second distance d2, respectively, during a debonding process. In some embodiments, the first distance d1 may be equal to the second distance d2. The first insertion distance d1 and the second insertion distance d2 can respectively be in a range of from about 8 mm to about 12 mm optimized to reduce the possibility of wafer breakage. In some embodiments, strain sensors 416 may be utilized to monitor the mechanical compression of the second wafer 401b during the insertion of the first and second blades 409a and 409b, in order to avoid wafer breakages. In some embodiment, the strain sensors 416 may gauge the mechanical displacement of the second wafer 401b by generating an electrical signal as a function of the straining pressure imposed during the debonding process. In some embodiments, the strain sensors 416 comprise of a resistive transducer 417 that converts the mechanical elongation or compression of the second wafer 401b into a resistance change. In further embodiments, pressure sensors 418 may be coupled to the first and second blades 409a and 409b and configured to measure pressure asserted on the bonding interface of the first and second wafers 401a and 401b. For example, if the first blade 409a or the second blade 409b are inserted into the first wafer 401a or second wafer 401b, instead of in between the bonded wafers, a high pressure may be detected by the pressure sensors 418. In other embodiments, the AOI system 109 (FIG. 1A) may be used to control the insertion distances d1 and d2.

Referring still to FIG. 4, the pair of bonded first and second wafers 401a and 401b may have a preset maximum diameter D 403. In various embodiments, the preset maximum diameter D 403 may be optimized to reduce the possibility of wafer breakage. As such, in some embodiments, the preset maximum diameter D 403 may be 12 inches (i.e. 300 mm) wafers before dicing and packaging. In further embodiments, the bonded wafers 401a and 401b are placed on a wafer chuck 407 and are concentric to the wafer chuck 407. In some embodiments, the wafer chuck 407 has a preset maximum lateral dimension (e.g., a diameter if circular) D' 405 that is smaller than the maximum diameter D of the bonded wafers 401a and 401b. For example, the maximum dimension D' 405 of the wafer chuck 407 may be 8 inches. In some embodiments, the maximum dimension 405 D' can be about 0.5 to about 0.9 times of the maximum diameter D of the bonded wafers 401a and 401b, such that the bonded wafers 401a and 401b have a desired peripheral space (free-standing peripheral area) for performing the debonding process. In some embodiments, the maximum dimension 405 D' may be determined so that the wafer chuck 407 provides a desired back support to the bonded wafers 401a and 401b and reduces the possibility of wafer breakage using the debonding process. In some embodiments, the wafer chuck 407 may have the maximum dimension 405 D' in a range of from about 150 mm (millimeter) to about 250 mm.

In some embodiments, the wafer debonding method may use a pair of pulling heads 415a and 415b arranged diametrically opposite to each other for pulling up the second wafer 401b. In some further embodiments, more than two pulling heads can also be placed on a top surface of the second wafer 401b for lifting off the second wafer 401b from the first wafer 401a. Moreover, the plurality of the pulling heads may be arranged according to a certain pattern such as linear, circular, or parabolic, in order to provide enhanced pulling forces. Furthermore, the pulling forces provided by the plurality of the pulling heads may be unbalanced and individually controlled by the AOC system 109, for example.

Based on the arrangements described above, the two separating blades 409a and 409b, inserted at different depths between the bonded wafers 401a, 401b, may cause a fulcrum to move to different positions. For example, initial insertion depths d1 and d2 of the two separating blades 409a and 409b, respectively, may result in fulcrums positioned at an initial distance d 411 from the pulling heads 415a, 415b. Furthermore, as the insertion depths of the two separating blades 409a and 409b increases, the fulcrums may be positioned at a distance d' 413 from the pulling heads 415a, 415b. In some embodiments, a larger insertion depth may enhance debonding wave propagation and reduce debonding force, and thus, a smaller wafer bending is introduced on each side of the pair of bonded wafers 401a and 401b to reduce the possibility of wafer breakage.

Figure 5:
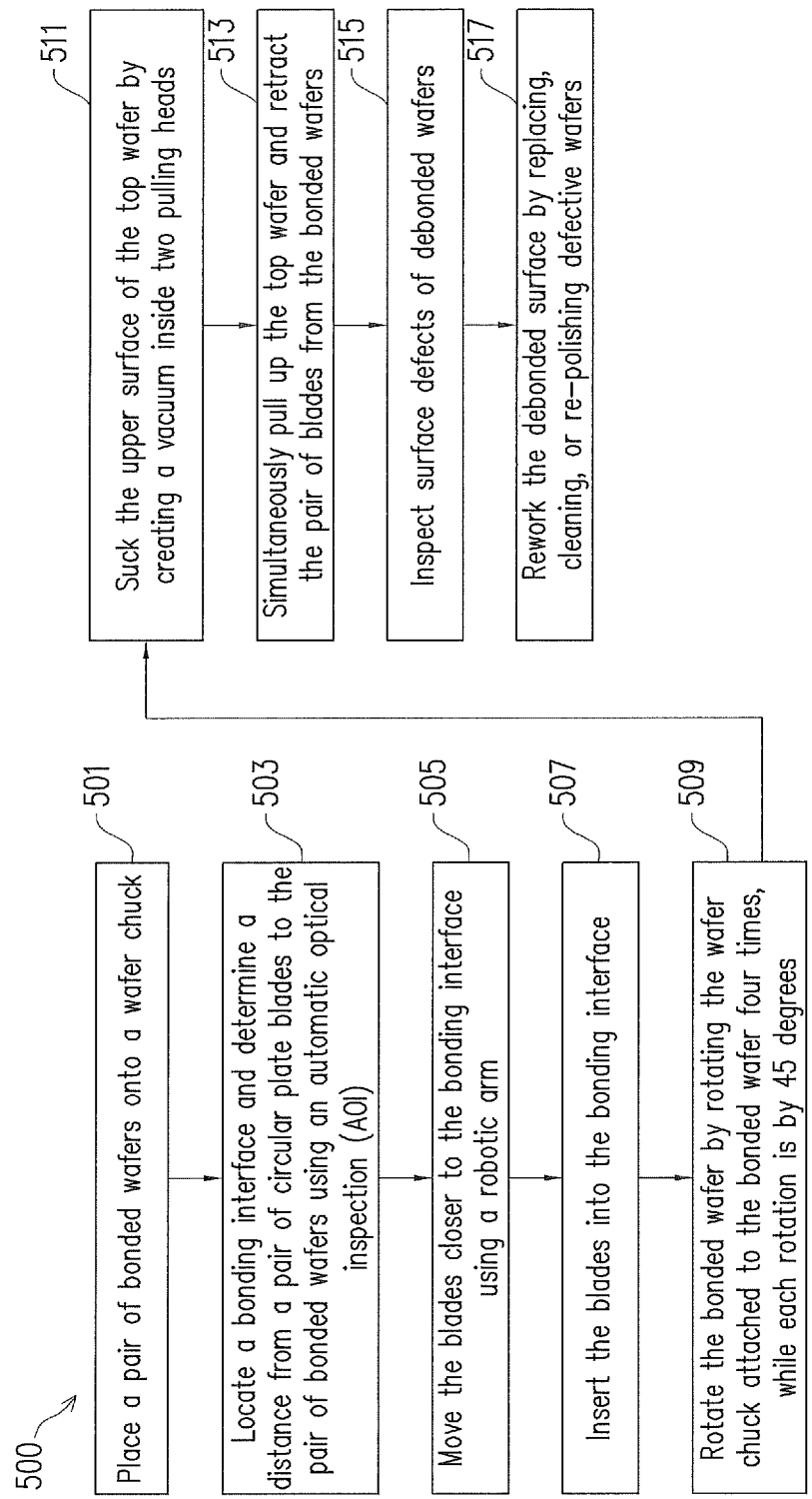
FIG. 5 illustrates a flow diagram of a wafer debonding method for debonding a pair of bonded wafers using a pair of circular plate blades, in accordance with some embodiments.

FIG. 5 illustrates a flow diagram of a wafer debonding method for debonding a pair of bonded wafers using a pair of circular plate blades, in accordance with some embodiments. Although a method 500 is described in relation to FIGS. 1-4, it will be appreciated that the method 500 is not limited to such structures disclosed in FIGS. 1-4 and may stand alone independent of the structures disclosed in FIGS. 1-4. In addition, some operations of the method 500 may occur in different orders and/or concurrently with other operations or events apart from those illustrated and/or described herein. Moreover, not all illustrated operations may be required to implement one or more aspects or embodiments of the present disclosure. Further, one or more of the operations depicted herein may be carried out in one or more separate operations and/or phases.

At operation 501, a pair of bonded wafers are placed onto a wafer chuck. In some embodiments, the pair of bonded wafers may be attached to the wafer chuck using a vacuum. In various embodiments, prior to operation 501, a first wafer of the pair of bonded wafers may be processed to form features, such as circuits, connecting layers, contacts, and other applicable structures. In some embodiments, a second wafer of the pair of bonded wafers may include a substrate made of semiconductor, sapphire, thermoplastic polymer, oxide, carbide, or other suitable material.

At operation 503, a bonding interface of the first and second wafers is located using an automatic optical inspection (AOI) system. For example, a pad probe or an optical scan may be performed over the edge surfaces of the bonded wafers. In further embodiments, at operation 503, wafers misalignment and whether the interface voids are in the desired regions may be determined. Furthermore, the AOI system may also determine a distance from a pair of circular plate blades to the pair of bonded wafers.

At operation 505, based on a feedback received from the AOI system, a robotic arm or other mechanism move the blades to a closest point near the interface. In some embodiments, the robotic at in comprises a blade portion configured to support a separating blade and may include sensors to enhance the positioning of the blade portion with respect to the pair of bonded wafers to prevent scratching a surface of the pair of bonded wafers. In some embodiments, the blade portion is substantially U-shaped to minimize the amount of contact between the blade portion and the edges of the bonded wafers. At operation 507, the pair of blades are slowly inserted into the bonding interface of the first and second wafers from edges to facilitate the debonding of the first and second wafers. In some embodiments, pressure detectors may be used to monitor, in real-time, the pressure applied to the first and second wafer during the insertion of the pair of blades. In this embodiment, the real-time pressure monitoring reduces the risk of wafer breakages during the operation 507. In this regard, the pressure measurements received from the pressure detectors may also help to determine how much further the pair of blades ought to be inserted between the first wafer and the second wafer or whether to retract the inserted pair of blades to avoid wafer breakage. In some embodiments, during the insertion operation 507, the pair of blades may be rotating in an opposite direction of the rotating wafer chuck.

At operation 509, the bonded wafers are rotated multiple times through the rotating chuck attached to the bottom surface of the first wafer. In some embodiments, the bonded wafers are rotated four times, by 45° degrees during each rotation. In other embodiments, the bonded wafers may be rotated by more than 360° degrees depending on the wafer substrate type and/or other manufacturing process needs.

At operation 511, two pulling heads are attached to the upper surface of the second wafer by creating the vacuum inside the pulling heads. At operation 513, the first wafer is debonded and separated from the first wafer. The debonding process can be performed using the debonding system and methods disclosed in this application. A pair of different or same pull forces can be utilized to facilitate the debonding process while simultaneously retracting the pair of inserted blades. This will result in fewer edge defects and/or reduced wafer breakage rates. At operation 515, the debonded first wafer and second wafer are inspected for surface defects, brakes and scratches. At operation 517, the debonded surfaces of the first wafer and the second wafer may be reworked by replacing, cleaning, or re-polishing defective wafers.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations are used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, signal, etc. that is physically constructed, programmed, arranged and/or formatted to perform the specified operation or function.

Furthermore, a person of ordinary skill in the art would understand that various illustrative logical blocks, modules, devices, components and circuits described herein can be implemented within or performed by an integrated circuit (IC) that can include a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A processor programmed to perform the functions herein will become a specially programmed, or special-purpose processor, and can be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according to embodiments of the present disclosure.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. A method for debonding a pair of bonded wafers, the method comprising:
   attaching a pair of bonded wafers onto a wafer chuck using vacuum suction;
   determining a bonding interface between the pair of bonded wafer using an automatic optical inspection (AOI) system;
   inserting a plurality of separating blades into the bonding interface using a robotic arm;
   rotating the pair of bonded wafers by rotating the wafer chuck attached to the bonded wafers; and
   pulling up a top wafer of the pair of bonded wafers so as to debond the pair of bonded wafers, while simultaneously retracting the plurality of separating blades from the bonded wafers.

2. The method of claim 1, further comprising inspecting surface defects of the debonded wafers.

3. The method of claim 2, further comprising cleaning and re-polishing the debonded surfaces.

4. The method of claim 3, further comprising rotating the pair of bonded wafers four times, wherein each rotation is by 45 degrees.

5. The method of claim 1, further comprising monitoring, using pressure detectors, pressure in the pair of bonded wafers during the inserting step of the plurality of separating blades.

6. The method of claim 1, wherein the plurality of separating blades are rotated in an opposite direction to the rotating wafer chuck.

7. A method for debonding a pair of bonded wafers, the method comprising:
   attaching a pair of bonded wafers onto a wafer chuck;
   inserting a plurality of separating blades into a bonding interface between a first wafer and a second wafers of the pair of bonded wafer using a robotic arm, wherein the plurality of separating blades are substantially equally spaced from each other around the pair of bonded wafers;
   pulling the second wafer upwardly so as to debond the second wafer from the first wafer using at least one pulling head; and
   monitoring pressure applied to the first wafer and the second wafer during inserting the plurality of separating blades into the bonding interface.

8. The method of claim 7, wherein a cross section of a leading portion of at least one of the plurality of separating blades has a shape selected from: a rounded wedge, a square wedge and a triangular wedge.

9. The method of claim 7, wherein each of the plurality of separating blades have a Young's modulus in a range of from about 3 Gigapascal (GPa) to about 3.95 Gigapascal (GPa).

10. The method of claim 7, wherein the plurality of separating blades comprises a plurality of circular plate separating blades each configured to rotate in an opposite direction of the pair of bonded wafers.

11. The method of claim 7, wherein during inserting the plurality of separating blades into the bonding interface, the plurality of separating blades are controlled by an automatic optical inspection (AOI) system configured to control insertion depths of the pair of separating blades.

12. The method of claim 11, further comprising determining insertion points for inserting the plurality of separating blades between the bonded wafers using the AOI system.

13. The method of claim 7, wherein the at least one pulling head comprises a first pulling head and a second pulling head configured to apply a first pull force and a second pull force, respectively.

14. The method of claim 13, wherein the first and second pull forces are unequal.

15. A method for debonding a pair of bonded wafers, the method comprising:
   attaching a pair of bonded wafers to a top surface of a wafer chuck;
   arranging a plurality of separating blades that are substantially equally spaced from each other around the pair of bonded wafers;
   inserting the plurality of separating blades between a first wafer and a second wafer of the pair of bonded wafers;
   pulling the second wafer upwardly using at least one pulling head so as to debond the first wafer from the second wafer;
   monitor the pulling process using a camera of an automatic optical inspection (AOI) system;
   transmitting feedback signals to actuators controlling the plurality of separating blades and the at least one pulling head; and
   measuring, using the AOI system, an inserting speed, depth, and slope of the plurality of separating blades and feeding back, using the AOI system, the measured inserting speed, depth, and slope to a controller that is configured to control a rotating speed of the plurality of separating of blades.

16. The method of claim 15, wherein the plurality of separating blades comprise two circular plate separating blades configured to rotate at different speeds from each other.

17. The method of claim 15, wherein each of the plurality of separating blades have a thickness in a range of from about 2 mm to about 6 mm.

18. The method of claim 15, wherein inserting the plurality of separating blades comprises:

inserting a first separating blade from the plurality of separating blades between the bonded wafers to a first distance; and inserting a second separating blade from the plurality of separating blades between the bonded wafers to a second distance that is different from the first distance.

19. The method of claim 15, further comprising retracting the plurality of separating blades when pulling the second wafer upwardly.

20. The method of claim 15, wherein each of the plurality of separating blades have a Young's modulus in a range of from about 3 Gigapascal (GPa) to about 3.95 Gigapascal (GPa).

* * * * *